United States Patent [19]

Barrows

[11] Patent Number: 4,583,233
[45] Date of Patent: Apr. 15, 1986

[54] METHOD OF MONITORING SUITABILITY OF A TRANSMISSION PATH FOR TRANSMISSION OF DIGITAL DATA SIGNALS, AND APPARATUS FOR USE IN CARRYING OUT THE METHOD

[75] Inventor: Charles R. Barrows, Portland, Oreg.

[73] Assignee: Tektronix, Inc., Beaverton, Oreg.

[21] Appl. No.: 472,429

[22] Filed: Mar. 7, 1983

[51] Int. Cl.⁴ .................... H04B 17/00; H04N 17/00
[52] U.S. Cl. ........................................ 375/10; 358/139
[58] Field of Search .................... 358/139, 150, 10; 178/69 R, 69 A; 370/13; 371/22; 375/10, 13; 455/67; 328/187, 188; 324/77 R, 95

[56] References Cited

U.S. PATENT DOCUMENTS 2,738,417  3/1956  Hunt et al. ............................ 375/13
3,390,336  6/1968  DiToro ................................. 375/13

Primary Examiner—Benedict V. Safourek
Attorney, Agent, or Firm—John Smith-Hill

[57] ABSTRACT

A transmission path is monitored for its suitability for transmission of digital data by transmitting over the transmission path a video test signal which includes a horizontal sync pulse and at least one half-cycle of a generally sinusoidal pulse occurring at a predetermined time after the sync pulse, the generally sinusoidal pulses being inverted in alternate lines or alternate fields of the video test signal. The signal received at the other end of the transmission path is displayed on an oscilloscope-type CRT device having its horizontal sweep triggered by the horizontal sync pulse, so as to superimpose the alternate generally sinusoidal pulses. The configuration of the generally eye-shaped area resulting from such superimposition depends on the suitability of the transmission path for transmission of digital data.

6 Claims, 4 Drawing Figures

METHOD OF MONITORING SUITABILITY OF A TRANSMISSION PATH FOR TRANSMISSION OF DIGITAL DATA SIGNALS, AND APPARATUS FOR USE IN CARRYING OUT THE METHOD

This invention relates to a method of monitoring suitability of a transmission path for transmission of digital data signals, and apparatus for use in carrying out the method.

BACKGROUND OF THE INVENTION

It is well known to use an eye diagram to monitor the suitability of a transmission path (which term is used herein to designate both a broadcast medium, such as air, and a transmission line) between a transmission location and a remote receiving location for transmission of digital data. The eye diagram is conventionally generated by impressing a sinusoidal signal on the transmission path at the transmission location, and displaying the signal received at the receiving location on a dual-trace oscilloscope-type cathode ray tube (CRT). The two traces are triggered at points 180° out of phase with each other, so that the positive half-wave of one waveform and the negative half-wave of the other waveform enclose an area shaped somewhat as the human eye.

The suitability of a transmission path for transmission of digital data is, to a large extent, dependent on the high-frequency rolloff of the transmission path, i.e., the manner in which the attenuation factor of the path increases as a function of the frequency of the signal to be transmitted. The severity of the high frequency rolloff of the transmission path manifests itself in the eye diagram as a distortion from its ideal form. Thus, instead of the CRT display showing an eye in which the peaks and troughs of the eyes are precisely half way between the intersections of the waveforms, the peak and trough between two successive intersections are closer, along the time axis, to the earlier intersection than to the later intersection. The use of eye diagrams is discussed at length in Chapter 27 of "Transmission Systems for Communications," Bell Telephone Laboratories, 1971, and Ingram, "Analysis and Design of Digital Transmission Systems," Computers and Digital Techniques, 1979, Vol, 2, No. 3.

One problem with the conventional method of providing an eye diagram is that of reliably triggering the horizontal sweep of the CRT. It is difficult to insure that the two traces of the CRT will trigger at precisely corresponding points on the sine wave.

SUMMARY OF THE INVENTION

According to a first aspect of the present invention there is provided a method of monitoring suitability of a tranmission path for transmission of digital data, comprising transmitting over the transmission path a video test signal which includes a horizontal sync pulse and at least one half cylce of a generally sinusoidal pulse occurring at a predetermined time after the sync pulse, the generally sinusoidal pulses being inverted in alternate lines or alternate fields of the video test signal, receiving the transmitted test signal and displaying the received test signal on an oscilloscope-type CRT device having its horizontal sweep triggered by the horizontal sync pulse so as to superimpose the alternate generally sinusoidal pulses, the configuration of the generally eye-shaped area resulting from such superimposition depending on the suitability of the transmission path for transmission of digital data.

According to a second aspect of the present invention there is provided apparatus for use in monitoring suitability of a transmission path for transmission of digital data, said apparatus comprising a signal generator for generating a video test signal which includes a horizontal sync pulse and at least one half cycle of a generally sinusoidal pulse occurring at a predetermined time after the sync pulse, the generally sinusoidal pulses in alternate lines or alternate fields of the video test signal being inverted with respect to each other so that when the test signal is transmitted over a transmission path under test and the received signal is displayed on an oscilloscope-type CRT device, and the horizontal sync pulse is used for triggering the horizontal sweep of the CRT device, the alternate generally sinusoidal pulses can be superimposed, enclosing a generally eye-shaped area, the configuration of which area depends on the suitability of the propagation medium for transmission of digital data.

BRIEF DESCRIPTION OF THE DRAWING

For a better understanding of the invention, and to show how the same may be carried into effect, reference will now be made, by way of example, to the accompanying drawing in which:

FIG. 2(a) illustrates a portion of FIG. 1(c) drawn to an enlarged scale, while FIG. 2(b) illustrates a corresponding view obtained with a similar signal transmitted over a transmission path exhibiting high-frequency rolloff;

FIG. 1(a) shows a portion of one of two waveforms which is repeated at TV line rate and is used to generate an eye diagram display. The waveform comprises a negative-going horizontal sync pulse 2 followed by a color burst 4 centered on the blanking level 6 and a succession of positive-going pulses 8 each having the configuration of a $sin^2$ pulse. It will be appreciated that $sin^2 wt = \frac{1}{2}(1 - \cos 2wt)$, and that accordingly a $sin^2$ function has the same configuration as a sin function of twice the frequency, with a level shift. The successive $sin^2$ pulses 8 are separated by intervals during which the signal is at the blanking level, and the frequency of the $sin^2$ function decreases, so that the duration of the pulses increases, during the horizontal interval. In one example, the frequency is varied such that the half amplitude duration (HAD) of the pulses increases from 100 ns to 255 ns at 5 ns increments.

Figure 1:
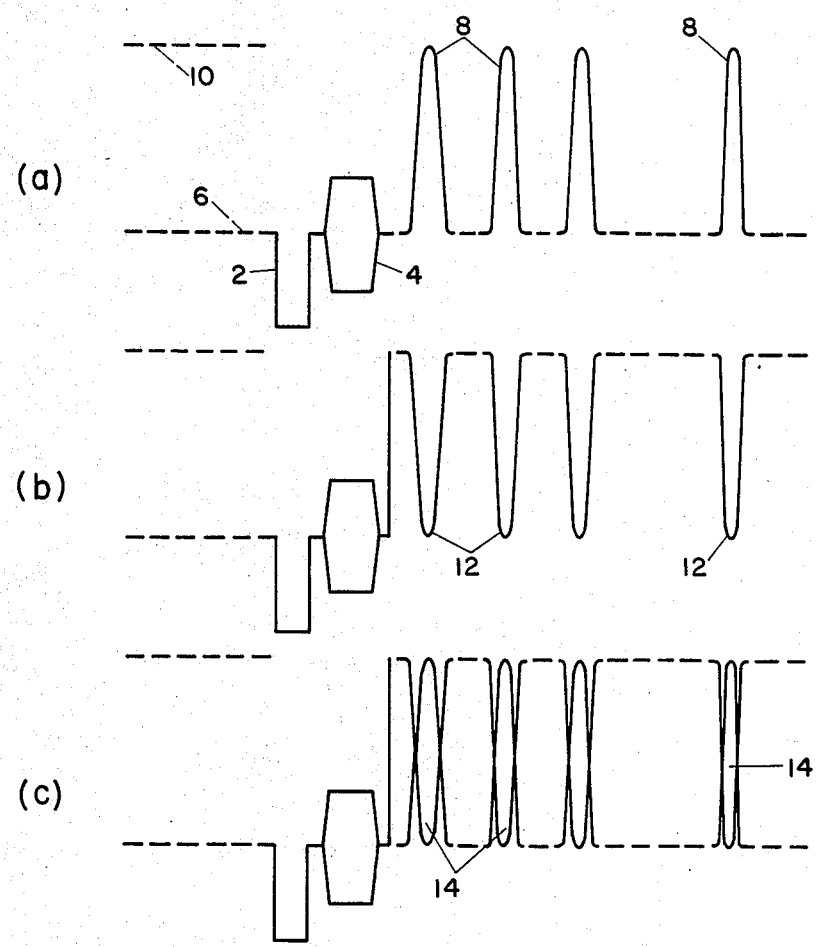
FIG. 1 illustrates waveforms of two parts of a signal which is used to generate an eye diagram display, the signal having been transmitted over a nominally distortionless transmission path.

Each of the $sin^2$ pulses 8 constitutes an excursion from the blanking level 6 of the video test signal to the white level 10 of the video signal.

The waveform illustrated in FIG. 1(b) is similar to that shown in FIG. 1(a) except that the $sin^2$ pulses 12 are negative-going from the white level of the video signal. It is possible to ensure that the durations of the $sin^2$ pulses 12 are equal to the durations of the corresponding pulses 8 and occur at the same times, relative to the sync pulse, as the corresponding pulses 8.

FIG. 1(c) illustrates the display that is obtained when a video test signal composed of the waveforms shown in FIGS. 1(a) and 1(b) in alternate lines or alternate fields respectively is displayed on a waveform monitor including an oscilloscope-type CRT which is triggered off the horizontal sync signal. In the case where the test signal is composed of the two waveforms in alternate lines respectively, the electron beam of the CRT is deflected in the y direction on successive traces in dependence upon the voltage levels of the two waveforms respectively, so that the two waveforms are displayed in super position. The display that is obtained when the test signal is composed of the two waveforms in alternate fields respectively is essentially the same. It will therefore be apparent that in either case the peaks of the FIG. 1(a) waveform and the inverted peaks of the FIG. 1(b) waveform enclose "eyes" 14. FIG. 2(a) illustrates on an extended time scale the eye that is obtained by superimposition of the pulses of 175 ns HAD.

The test signal is transmitted from the signal souce (e.g., a signal generator) to the waveform monitor through a nominally distortionless transmission path. It will be noted from FIG. 2(a) that each peak of the FIG. 1(a) waveform is vertically aligned with the corresponding inverted peak of the FIG. 1(b) waveform and that the peaks lie horizontally midway between the intersections 16 of the waveforms. The transmission path is not ideal, since a certain amount of ringing is shown in FIG. 2(a) at 18.

FIG. 2(b) shows the same portion of the eye diagram display as FIG. 2(a) when a 4.2 MHz low pass filter has been interposed in the transmission path between the signal generator and the waveform monitor. It will be seen that the vertical height of the eye is much smaller and that the ringing is much more pronounced. It will further be seen that the shape of the $\sin^2$ pulses has been distorted, in that the interval between the intersections of the waveforms is much longer than previously and their leading edges 20 are less steep than their trailing edges 22, with the result that the interval between the leading intersection and the peaks of the waveforms is greater than the interval between the peaks and the trailing intersection. It will be appreciated that FIG. 2(b) represents the suitability of the transmission path for transmission of digital data at a pulse repetition rate of 5.713 MHz (1/175 ns).

Figure 2:
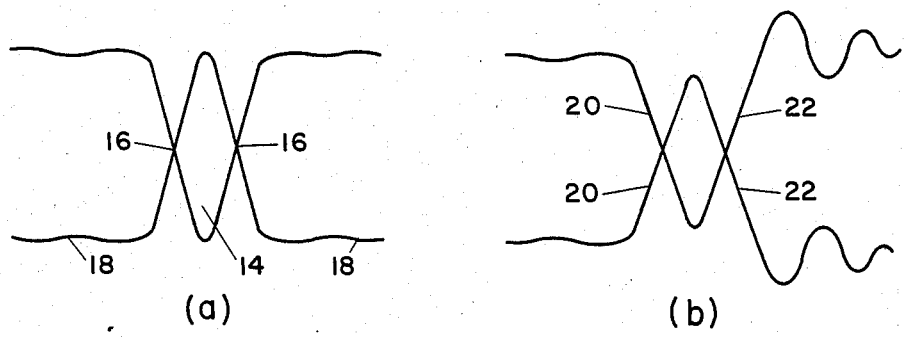
Figure 3:
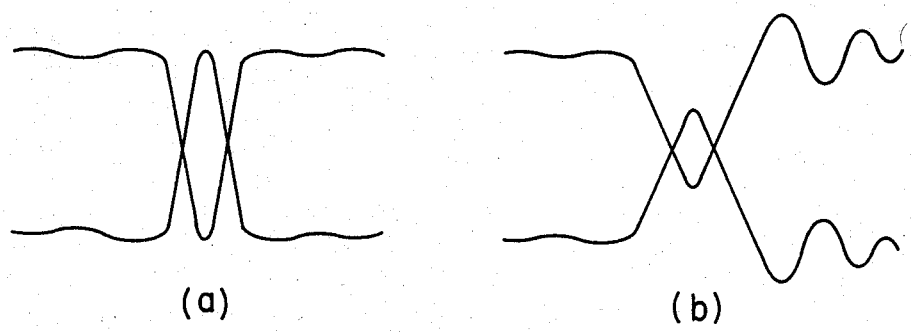
FIG. 3 illustrates waveforms corresponding to FIG. 2 but corresponding to a different portion of FIG. 1(c).

FIGS. 3(a) and 3(b) show views similar to FIGS. 2(a) and 2(b) but for the 125 ns HAD $\sin^2$ pulse. FIG. 3(b) represents the suitability of the transmission path for transmission of digital data at a pulse repetition rate of 8 MHz (1/125 ns).

The manner in which test signal may be generated will be readily apparent to persons skilled in the art, and therefore a detailed description of the signal generator is not provided. For example, the Tektronix 1900 Digital Generator may be used to generate the test signal.

Figure 4:
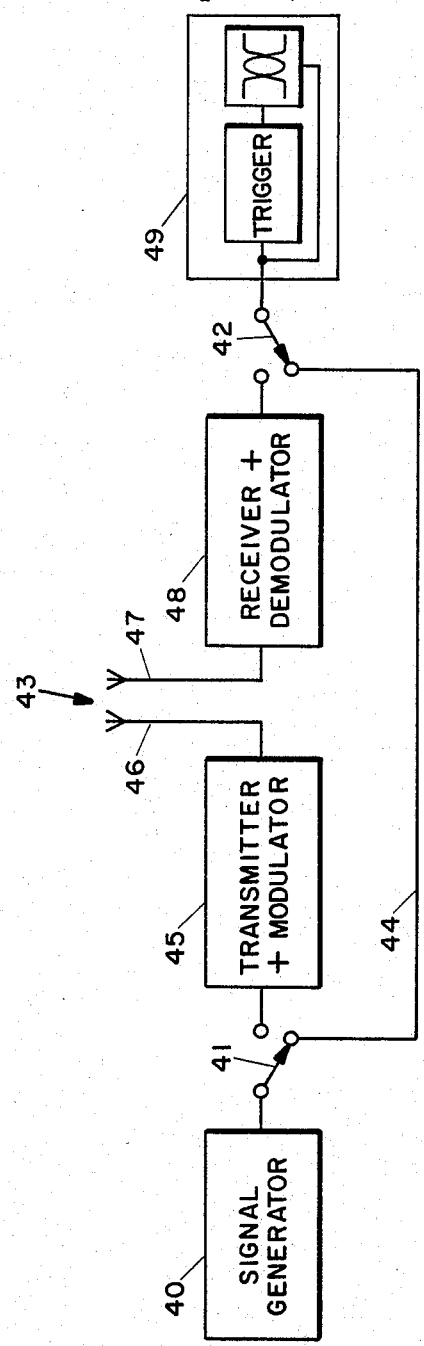
FIG. 4 is a simplified block diagram illustrating apparatus for carrying out the method described with reference to FIGS. 1 to 3.

The apparatus shown in FIG. 4 comprises a signal generator 40 which generates the test signal shown in FIG. 1. The test signal is applied to a switch 41 which is used in conjunction with a second switch 42 to select whether a broadcast medium 43 or a transmission line 44 is tested. If the broadcast medium is selected, the switch 41 applies the test signal to a transmitter and modulator 45 which drives transmission antenna 46. A receiving antenna 47 receives the broadcast signal and applies it to a receiver and demodulator 48 which extracts the test signal from the broadcast signal and applies it to a waveform monitor through the switch 42. In the event that the transmission line 44 is selected for testing, the test signal from the generator 40 is applied to the line 44 by the switch 41, and the switch 42 applies the transmitted test signal to the waveform monitor 49.

It will be appreciated that the invention is not limited to the particular method and apparatus that have been described since variations may be made therein without departing from the scope of the invention as defined in the appended claims and equivalents thereof. In particular, it is not necessary that $\sin^2$ pulses should be used.

I claim:

1. A method of monitoring suitability of a transmission path for transmission of digital data, comprising transmitting over the transmission path a video test signal which includes a horizontal sync pulse and at least one half-cycle of a generally sinusoidal pulse occurring at a predetermined time after the sync pulse, the generally sinusoidal pulses being inverted in alternate lines or alternate fields of the video test signal, receiving the transmitted test signal and displaying the received test signal on an oscilloscope-type CRT device having its horizontal sweep triggered by the horizontal sync pulse, so as to superimpose the alternate generally sinusoidal pulses, the configuration of the generally eye-shaped area resulting from such superimposition depending on the suitability of the transmission path for transmission of digital data.

2. A method according to claim 1, wherein each of said generally sinusoidal pulses is separated in each line of the test signal from the succeeding and preceding generally sinusoidal pulses by an interval in which the test signal level remains constant.

3. A method according to claim 2, wherein the constant level of the test signal intermediate consecutive generally sinusoidal pulses is, in alternate lines or alternate fields respectively, the blanking level or the white level.

4. A method according to claim 2, wherein the durations of the generally sinusoidal pulses of each line of the test signal are different from each other.

5. A method according to claim 1, wherein each of said generally sinusoidal pulses comprises a complete cycle of a generally sinusoidal waveform, from a phase angle of substantially $(2n+1)\pi/2$ radians to a phase angle of substantially $(2n+3)\pi/2$ radians.

6. Apparatus for use in monitoring suitability of a transmission path for transmission of digital data, said apparatus comprising a signal generator for generating a video test signal which includes a horizontal sync pulse and at least one half-cycle of a generally sinusoidal pulse occurring at a predetermined time after the sync pulse, the generally sinusoidal pulses in alternate lines or alternate fields of the video test being inverted with respect to each other, and the apparatus also comprising means for transmitting the test signal over a transmission path under test, means for receiving the signal transmitted over the transmission path, and a device for displaying the received signal, so that when the horizontal sync pulse is used for triggering the horizontal sweep of the display device, the alternate generally sinusoidal pulses can be superimposed, enclosing a generally eye-shaped area, the configuration of which area depends on the suitability of the transmission path for transmission of digital data.

* * * * *